(12) United States Patent
Ivanov et al.

(10) Patent No.: US 6,317,000 B1
(45) Date of Patent: Nov. 13, 2001

(54) OVERLOAD RECOVERY CIRCUIT AND METHOD

(75) Inventors: Vadim V. Ivanov; Shilong Zhang; Gregory H. Johnson, all of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/765,485

(22) Filed: Jan. 18, 2001

Related U.S. Application Data
(60) Provisional application No. 60/238,239, filed on Oct. 5, 2000.

(51) Int. Cl.$^7$ ............................................... H03F 3/45
(52) U.S. Cl. ............................................ 330/255; 330/267
(58) Field of Search .................................... 330/255, 264, 330/267

(56) References Cited

U.S. PATENT DOCUMENTS

| | | | |
|---|---|---|---|
| 4,241,313 | * 12/1980 | Takehara | 330/253 |
| 4,352,073 | 9/1982 | Leuthold | 330/264 |
| 4,622,521 | 11/1986 | Redfern | 330/9 |
| 4,714,896 | 12/1987 | Addis | 330/261 |
| 5,059,922 | 10/1991 | Mahabadi | 330/264 |
| 5,204,636 | 4/1993 | Werner, Jr. et al. | 330/85 |
| 5,311,145 | 5/1994 | Huijsing et al. | 330/255 |
| 5,374,857 | 12/1994 | Carobolante | 327/110 |
| 5,426,383 | 6/1995 | Kumar | 326/119 |
| 5,442,319 | 8/1995 | Seesink et al. | 330/261 |
| 5,546,045 | 8/1996 | Sauer | 327/561 |
| 5,699,015 | * 12/1997 | Dotson et al. | 330/255 |
| 5,864,245 | 1/1999 | Watarai | 326/81 |
| 5,917,378 | * 6/1999 | Juang | 330/253 |
| 6,037,826 | 3/2000 | Poletto et al. | 327/375 |
| 6,150,883 | * 11/2000 | Ivanov | 330/253 |

FOREIGN PATENT DOCUMENTS

| | | | |
|---|---|---|---|
| 0025655 | 2/1979 | (JP) | 330/253 |
| 0053910 | 4/1980 | (JP) | 330/267 |
| 0219207 | 9/1986 | (JP) | 330/253 |
| 404045603 | 2/1992 | (JP) | 330/253 |

\* cited by examiner

*Primary Examiner*—Robert Pascal
*Assistant Examiner*—Henry Choe
(74) *Attorney, Agent, or Firm*—W. Daniel Swayze, Jr.; W. James Brady; Frederick J. Telecky, Jr.

(57) ABSTRACT

An operational amplifier includes an input stage (13) receiving an input signal (Vin) and having first (14) and second (16) output terminals, and also includes an output stage (10) having a pull-up transistor (M11) and a pull-down transistor (M2). The pull-up transistor has a source coupled to a first supply voltage ($V_{DD}$), a gate coupled to the first output terminal (14), and a drain coupled to an output conductor (22) conducting an output signal (Vout). The pull-down transistor (M2) has a source coupled to a second supply voltage ($V_{SS}$), a gate coupled to the second output terminal (16), and a drain coupled to the output conductor (22). An AB control circuit (20) is coupled between the gates of the pull-up transistor and a pull-down transistor. A first overload recovery circuit (X) is coupled between the output conductor (22) and the gate of the pull-up transistor for limiting the voltage on the gate of the pull-up transistor in response to the output voltage (Vout) when the output voltage is within a first predetermined range of the first supply voltage ($V_{DD}$). A second overload recovery circuit (Y) is coupled between the output conductor (22) and the gate of the pull-down transistor for limiting the voltage on the gate of the pull-down transistor in response to the output voltage (Vout) when the output voltage is within a second predetermined range of the second supply voltage ($V_{SS}$).

19 Claims, 3 Drawing Sheets

OVERLOAD RECOVERY CIRCUIT AND METHOD

CROSS-REFERENCE TO RELATED APPLICATION

This application claims the benefit of prior filed co-pending U.S. provisional application Serial No. 60/238,239 filed Oct. 5, 2000 entitled "OVERLOAD RECOVERY CIRCUIT AND METHOD" by contributors Vadim V. Ivanov, Gregory H. Johnson, and Shilong (nmi) Zhang.

BACKGROUND OF THE INVENTION

The invention relates to high-speed CMOS operational amplifiers, and also to circuitry that reduces the amount of delay required for a high-speed CMOS operational amplifier to recover from a saturation condition.

U.S. Pat. Nos. 5,546,045, 4,622,521 and 4,714,896 represent the closest known prior art. U.S. Pat. No. 5,546,045 discloses a rail-to-rail bipolar class AB output stage.

It should be appreciated that until now, there have been very few commercially available high-speed CMOS operational amplifiers. This is because until very recently CMOS transistors that could be readily manufactured using reasonably low-cost CMOS integrated circuit manufacturing processes have had minimum channel length values that are not short enough (i.e., not less than about 0.7 microns) to allow CMOS operational amplifiers manufactured with such CMOS integrated circuit manufacturing processes to compete effectively with high-speed bipolar operational amplifiers manufactured using standard bipolar integrated circuit manufacturing processes. This is because the longer minimum channel lengths of the prior CMOS manufacturing processes result in large gate capacitances of all of the transistors, especially the pull-up transistors and pull-down transistors of the amplifier output stages. The large gate capacitances result in reduced circuit operating speeds compared to what has been achievable using of conventional bipolar integrated circuit manufacturing processes. It is possible for operational amplifiers made with a typical CMOS manufacturing process to have operating speeds comparable to those of conventional bipolar integrated circuit operational amplifiers only if the minimum channel lengths for transistors made using that CMOS manufacturing process are sufficiently small (e.g., less than approximately 0.6 microns for a circuit designed for use with low power supply voltages, or as much as approximately 2.0 microns for a circuit designed for use with high power supply voltages).

In prior art CMOS operational amplifiers, if the output voltage responds to the input signal by increasing to a level close to the positive supply voltage, the input stage of the operational amplifier, which typically includes a differential input stage and a folded cascode stage connected to the gate of the P-channel pull-up transistor, causes the gate of the P-channel pull-up transistor to be pulled down to a level near the ground or negative supply voltage level in order to adequately turn on the P-channel pull-up transistor. Typically, there is a large capacitance coupled to the conductor connected to the gate of the P-channel pull-up transistor. The large capacitance typically includes the gate capacitance of the pull-up transistor and the capacitance of the compensation capacitor of the operational amplifier. Consequently, if the input signal applied to the operational amplifier is rapidly decreased, the input stage of the operational amplifier needs to charge the gate voltage of the P-channel pull-up transistor to a high voltage nearly equal to the positive supply voltage before the P-channel pull-up transistor is turned off. The current supplied by the input stage of the operational amplifier to accomplish the charging up of the large capacitance coupled to and associated with the gate of the P-channel pull-up transistor is small, typically about 100 microamperes. Consequently, there is a substantial delay, referred to herein as an overload recovery delay, before the operational amplifier output voltage responds to the change in the input signal. The foregoing problem for the P-channel pull-up transistor is accompanied by an analogous overload recovery delay problem for the N-channel pull down transistor. The above described overload recovery delay problems have made CMOS operational amplifiers unsuitable for certain applications.

The above described problems for CMOS operational amplifiers also apply directly to CMOS comparators.

For a long time there has been a need for an inexpensive, high-speed integrated circuit operational amplifier with rapid recovery from a saturation or overload condition. This need has not been satisfied by prior CMOS operational amplifiers. Similarly, the need for an inexpensive, high-speed integrated circuit comparator with rapid recovery from a saturation or overload condition is not been satisfied by prior CMOS comparators.

SUMMARY OF THE INVENTION

Accordingly, it is an object of the invention to provide an inexpensive high-speed CMOS amplifier having rapid recovery from a saturation or overload condition.

It is another object of the invention to provide an inexpensive high-speed CMOS differential amplifier having rapid recovery from a saturation or overload condition.

It is another object of the invention to provide an inexpensive high-speed CMOS comparator having rapid recovery from a saturation or overload condition.

It is another object of the invention to provide an inexpensive high-speed CMOS differential amplifier which limits current supplied to a portion of the amplifier circuit, for example, a portion of a slew boost circuit in the amplifier circuit, during the same conditions wherein an output transistor of the differential amplifier is saturated.

It is another object of the invention to provide an inexpensive, high-speed integrated circuit CMOS operational amplifier which competes effectively in the marketplace with bipolar integrated circuit operational amplifiers.

It is another object of the invention to provide an inexpensive, high-speed integrated circuit CMOS comparator which competes effectively in the marketplace with bipolar integrated circuit comparators.

Briefly described, and in accordance with one embodiment thereof, the invention provides an operational amplifier including an input stage (13) receiving an input signal (Vin) and having first (14) and second (16) output terminals, and also including an output stage (10) having a pull-up transistor (M11) and a pull-down transistor M2. The pull-up transistor has a source coupled to a first supply voltage ($V_{DD}$), a gate coupled to the first output terminal (14), and a drain coupled to an output conductor (22) conducting an output signal (Vout). The pull-down transistor (M2) has a source coupled to a second supply voltage ($V_{SS}$), a gate coupled to the second output terminal (16), and a drain coupled to the output conductor (22). An AB control circuit (20) is coupled between the gates of the pull-up transistor and a pull-down transistor. A first overload recovery circuit (X) is coupled between the output conductor (22) and the gate of the pull-up transistor for limiting the voltage on the gate of the pull-up transistor in response to the output voltage (Vout) when the output voltage is within a first predetermined range of the first supply voltage ($V_{DD}$). A second overload recovery circuit (Y) is coupled between the output conductor (22) and the gate of the pull-down transistor for limiting the voltage on the gate of the pull-down transistor in response to the output voltage (Vout) when the output voltage is within a second predetermined range of the second supply voltage ($V_{SS}$).

DETAILED DESCRIPTION OF THE PREFERRED EMBODIMENTS

Figure 1:
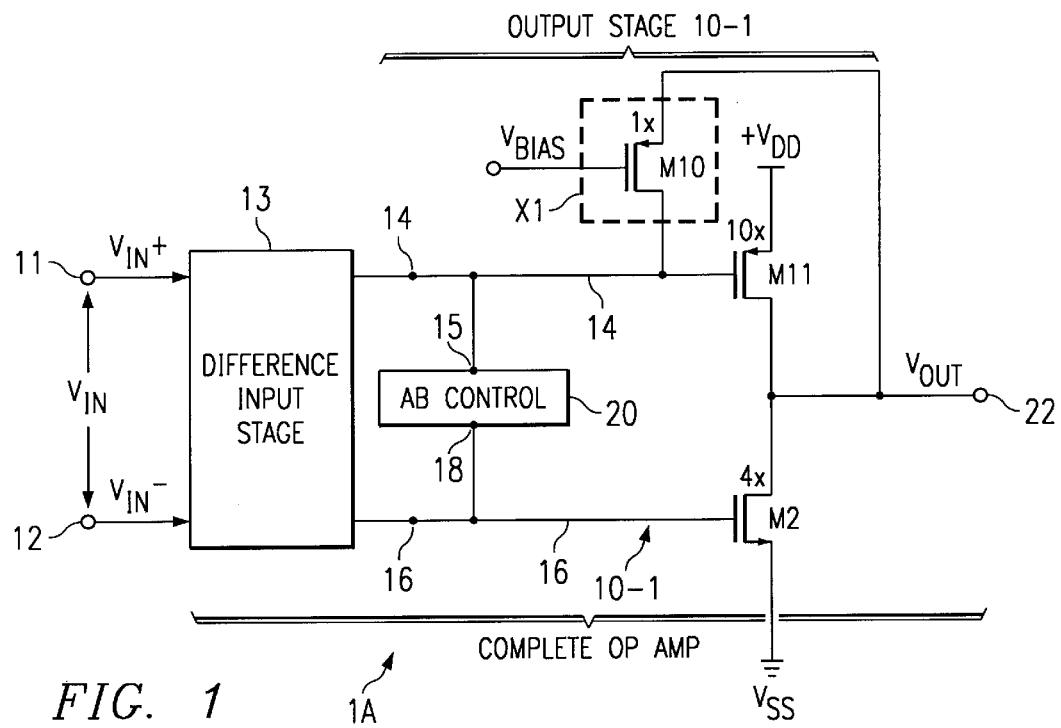
FIG. 1 is a schematic diagram of a basic embodiment of the invention for providing rapid recovery of a CMOS op amp from saturation close to the positive supply voltage rail.
Figure 2:
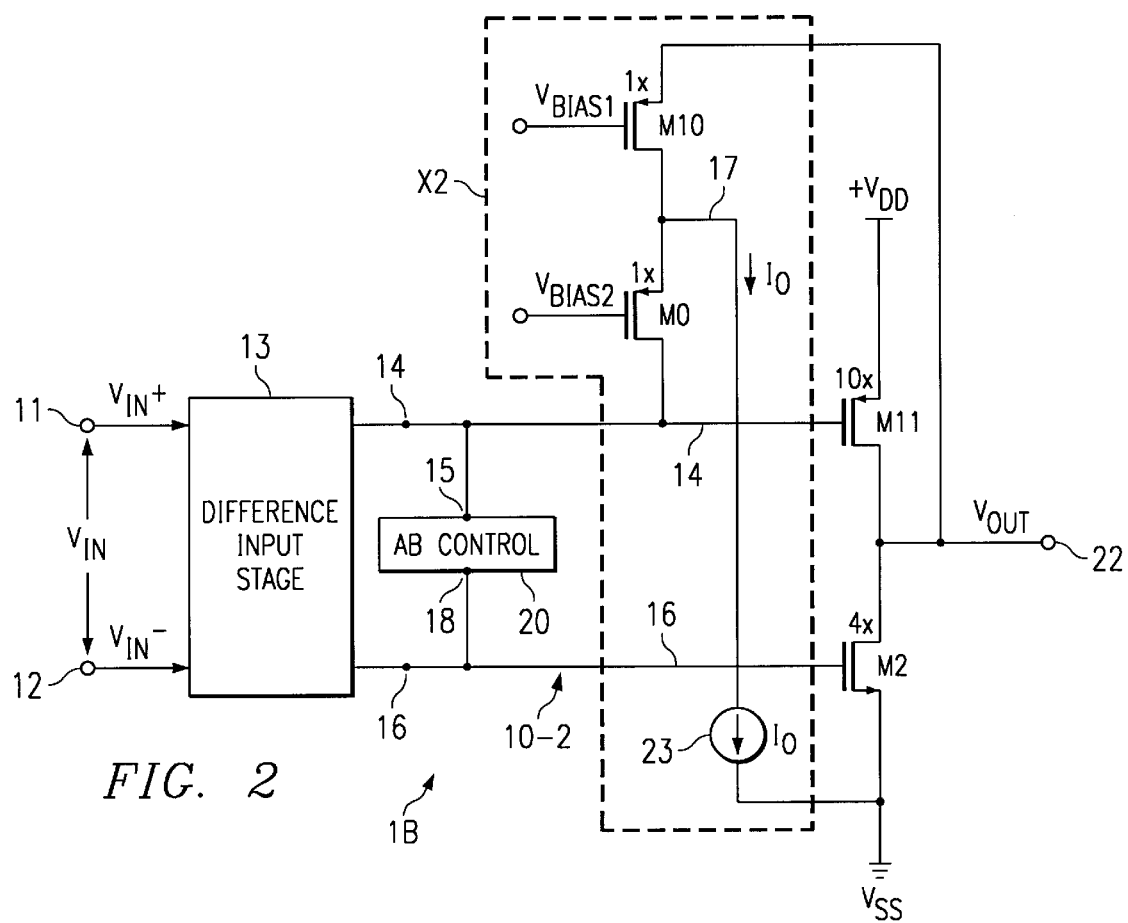
FIG. 2 is a schematic diagram of another embodiment of the invention for providing rapid recovery from saturation against the positive supply voltage rail.
Figure 3:
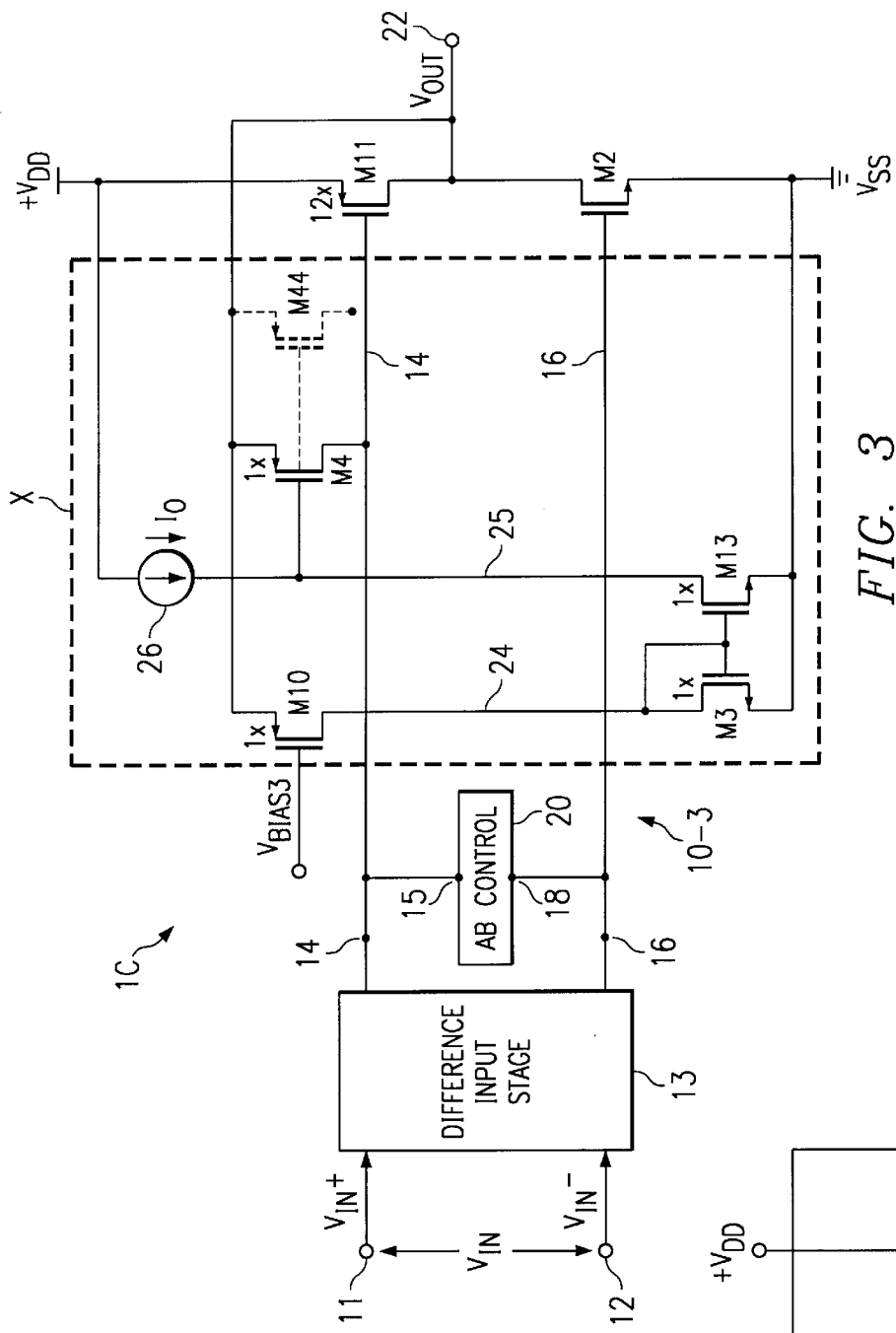
FIG. 3 is a schematic diagram of a preferred embodiment of the invention for fast recovery of saturation against the $+V_{DD}$ supply voltage rail.
Figure 4:
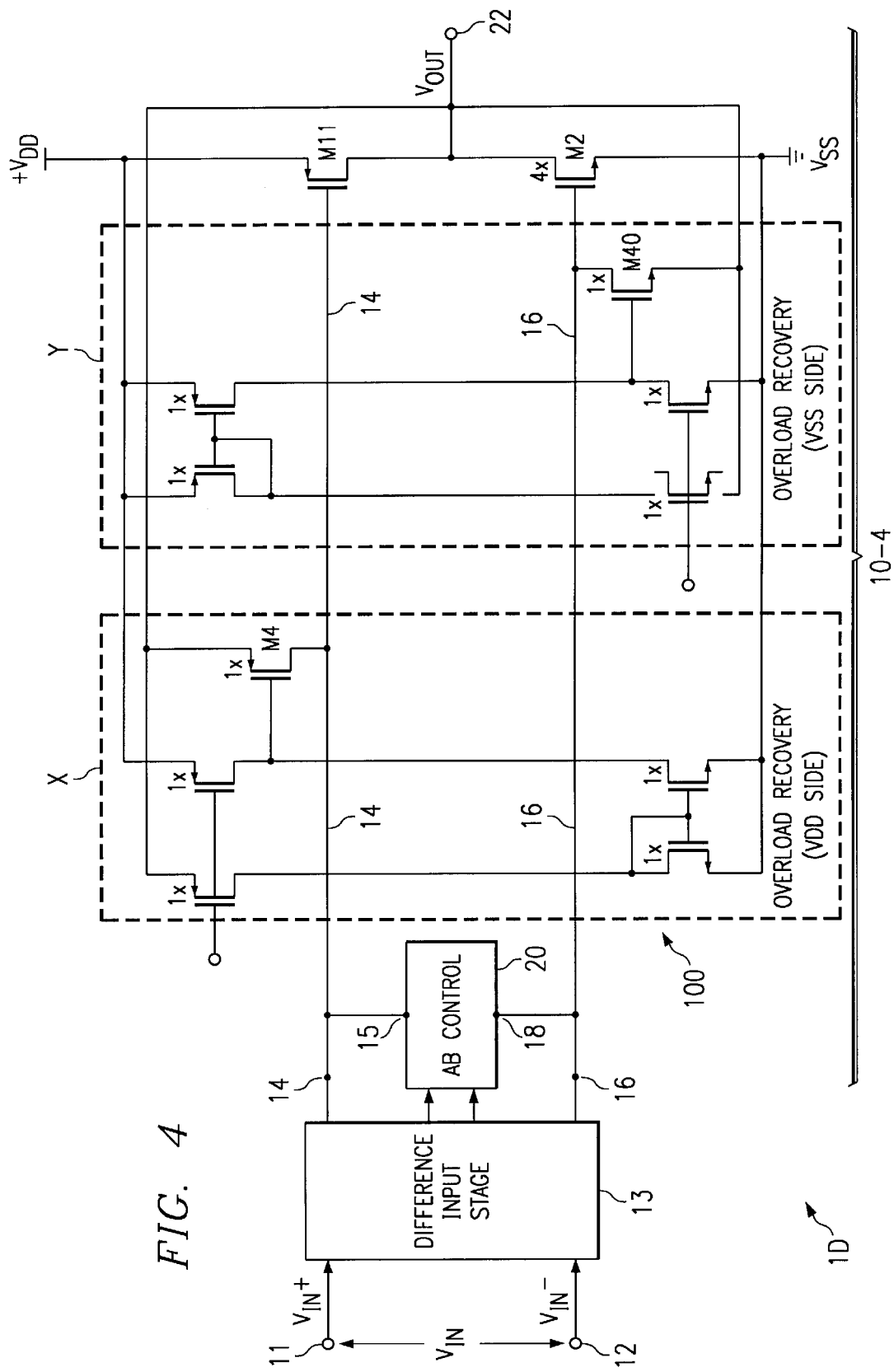
FIG. 4 is a schematic diagram of a preferred embodiment of the invention for providing rapid overload recovery of saturation against either the $+V_{DD}$ supply voltage or a ground or negative ($-V_{SS}$) supply voltage rail.

For simplicity, FIGS. 1, 2 and 3 show "recovery circuits" only for the P-channel output transistor M11 of the output stage 10 of an operational amplifier. FIG. 1 shows the simplest embodiment. FIG. 2 shows a more useful recovery circuit X2, and FIG. 3 shows the most practical implementation of the recovery circuit of the present invention. A practical operational amplifier would have recovery circuits for both the P-channel output transistor M11 and the N-channel output transistor M2, as shown in FIG. 4. The operational amplifier 1D of FIG. 4 includes both a $V_{DD}$-side recovery circuit X and a $V_{SS}$-side recovery circuit Y. The recovery circuit X in FIG. 4 is identical to the recovery circuit X shown in FIG. 3 coupled to the gate of the P-channel pull-up transistor M11. Recovery circuit Y in FIG. 4 is coupled to the gate of the N-channel pull-down transistor M2, and is similar to recovery circuit X.

Referring to FIG. 1, operational amplifier 1A includes a differential input stage 13 which receives an input signal $V_{in}^+$ on an input conductor 11 and also receives an input signal $V_{in}^-$ on an input conductor 12, so that a differential input voltage $V_{in}$ equal to $V_{in}^+$ minus $V_{in}^-$ is applied to differential input stage 13. In response, differential input stage 13 produces output signals conducted by conductors 14 and 16 the respective inputs of an output stage 10-1.

Output stage 10-1 includes a conventional class AB control circuit 20 including a first input terminal 15 connected to conductor 15 and a second input terminal 18 connected to conductor 16. Typically, the input terminals of class AB control circuit 20 also constitute the output terminals, so input/output terminal 15 is directly connected to conductor 14 and input/terminal 18 is directly connected to conductor 16 Class AB control circuit 20 can be similar to one disclosed in U.S. Pat. No. 5,311,145 by Hujising et al.

Output stage 10-1 also includes a P-channel pull-up transistor M11 and an N-channel pull-down transistor M2. Pull-up transistor M11 has its source connected to $+V_{DD}$ (which typically is about +5 volts), its gate connected by conductor 14 to the first output 14 of class AB control circuit 20, and its drain connected to an output conductor 22 on which an output voltage $V_{out}$ is produced. N-channel pull-down transistor M2 has a source connected to a ground/negative supply voltage, a gate connected by conductor 16 to the second output 18 of class AB control circuit 20, and a drain connected to output conductor 22.

Output stage 10-1 also includes a bias recovery circuit X1, which includes a P-channel recovery transistor M10. A bias voltage $V_{BIAS}$ is applied to the gate of recovery transistor M10, which has its source connected to output conductor 22 and its drain connected by conductor 15 to the gate of pull-up transistor M11. In the embodiment of FIG. 1, recovery circuit X2 includes only recovery transistor M10 and its gate bias voltage $V_{BIAS}$.

Referring to FIG. 2, operational amplifier 1B is similar to operational amplifier 1A of FIG. 1, except that the recovery circuit X2 of output stage 10-2 in FIG. 2 is more complex than the recovery stage X1 in output stage 10-1 of FIG. 1. Specifically, recovery circuit X2 in FIG. 2 includes transistors M10 and M0 and a constant current source 23 conducting a current $I_o$. A bias voltage $V_{BIAS1}$ is applied to the gate of recovery transistor M10. The drain of recovery transistor M10 is coupled by a P-channel transistor M0 to conductor 14. The drain of transistor M10 is connected by conductor 17 to a first terminal of a constant current source 23, the second terminal of which is connected to ground or $V_{SS}$. The gate of transistor M0 is connected to a second bias voltage $V_{BIAS2}$.

Referring to FIG. 3, another operational amplifier 1C is similar to operational amplifier 1B of FIG. 2, except that in FIG. 3 the output stage 10-3 includes a preferred embodiment of a recovery circuit X. In FIG. 3, rail-to-rail output stage 10-3 includes class AB control circuit 20 and recovery circuit X coupled to conductors 14 and 16. Recovery circuit X includes P-channel transistors M10 and M4, N-channel current mirror transistors M3 and M13, and constant current source 26. Transistor M10 has its source connected to output conductor 22, its gate connected to a bias voltage $V_{BIAS3}$, and its drain connected by conductor 24 to the drain and gate of current mirror transistor M3 and to the gate of current mirror transistor M13. The sources of current mirror transistors M3 and M13 are connected to ground. The drain of transistor M13 is connected by conductor 25 to a first terminal of a constant current source 26 having a second terminal connected to $+V_{DD}$. A constant current $I_o$ thus is applied to transistor M13 by constant current source 26. Conductor 25 also is connected to the gate of transistor M4, which has its source connected to output conductor 22 and its drain connected to conductor 14.

FIG. 4 shows an operational amplifier 1D which includes differential input stage 13 and an output stage 10-4. Output stage 10-4 includes class AB control circuit 20, pull-up transistor M11, and pull-down transistor M2 as previously described, and also includes an overload recovery circuit 100. Overload recovery circuit 100 includes both a $V_{DD}$-side overload recovery circuit X and a $V_{SS}$-side overload recovery circuit Y. $V_{DD}$-side overload recovery circuit X is identical to the overload recovery circuit X shown in FIG. 3. $V_{SS}$-side overload recovery circuit Y is similar to $V_{DD}$-side overload recovery circuit X except that the P-channel transistors of recovery circuit X have been replaced in recovery circuit Y by N-channel transistors, and the connections of the transistors to $V_{DD}$ and ground in recovery circuit Y are reversed from the corresponding connections of the transistor to ground and $V_{DD}$, respectively.

Referring next to the operation of operational amplifier 1A of FIG. 1, the bias voltage $V_{BIAS}$ applied to the gate of transistor M10 is set to a value which is lower than $V_{DD}$ by an amount equal to the sum of the $V_{GS}$ threshold voltage of transistor M6 and about 100 millivolts.

Consequently, recovery transistor M10 is off until $V_{out}$ is pulled to within approximately 100 millivolts of $V_{DD}$, at which point recovery transistor M10 starts turning on. This causes current from $V_{out}$ terminal 22 to flow through recovery transistor M10 into conductor 14. When $V_{out}$ is pulled close enough to $+V_{DD}$ to cause the current through recovery transistor M10 to exceed or overcome the above mentioned approximately 100 microampere current from differential input stage 13, then differential input stage 13 is no longer able to pull the voltage of conductor 14 lower.

That prevents further "saturation" of output stage 10-1, and substantially reduces the overload recovery delay time required to re-charge the large capacitance associated with conductor 15 to a voltage high enough to turn pull-up transistor M11 off, in the event of a sudden decrease in the input signal $V_{in}$ applied to differential input stage 13. Unfortunately, the $I_D$ vs. $V_{GS}$ characteristic of recovery transistor M10 is such that there is a 300 mV increase in $V_{out}$ required to turn recovery transistor M11 on from the edge of conduction to the point at which it is conducting 100 microamperes. The amount of time required for $V_{out}$ to increase that 300 millivolts closer to $+V_{DD}$ adds substantially to the overload recovery delay. Furthermore, the open-loop gain of operational amplifier 1A is significantly reduced whenever $V_{out}$ is within the wide (more than 300 millivolts) range during which recovery transistor M10 is conducting current into conductor 14.

The above described operational amplifier 1B of FIG. 2 partly solves that problem, by coupling the drain of transistor M10 to conductor 14 by means of P-channel transistor M0. The drain of transistor M10 and the source of transistor M0 both are connected by conductor 16 to a constant current source $I_0$. No current is conducted into conductor 14 by recovery transistor M0 until pull-up transistor M11 has pulled $V_{out}$ close enough to $+V_{DD}$ to turn recovery transistor M10 on so as to supply as much slew boost current into conductor 14 in excess of $I_0$ as is needed to accomplish the desired reduction in overload recovery delay. The circuit of FIG. 2 allows pull-up transistor M11 to pull $V_{out}$ within about 50 millivolts of $+V_{DD}$ before enough current flows through recovery transistor M0 to prevent conductor 14 from being pulled closer to ground by differential input circuit 13. In the configuration of FIG. 2, the bias voltage applied to the gate of transistor M10 and the value of the constant current I0 are selected such that transistor M10 is kept on for a wider range of values of $V_{out}$ without decreasing the open-loop gain of operational amplifier than is the case for the recovery transistor M10 in FIG. 1.

The advantage of the recovery circuit X2 of FIG. 2 over the recovery circuit X1 of FIG. 1 is that the open-loop gain of the operational amplifier 1B remains high over a wider range of $V_{out}$, because the recovery circuit X2 does not unacceptably reduce the gain of the operational amplifier until$V_{out}$ is within about 50 millivolts of $V_{DD}$.

The operational amplifier 1C of FIG. 3 provides a way of both providing effective overload recovery operation when needed and also preventing the overload recovery circuit X from diminishing the gain of operational amplifier 1C except while pull-up transistor M11 is holding $V_{out}$ to within 4 or 5 millivolts of $V_{DD}$. This desirable operation is accomplished by providing P-channel recovery transistor M4 connected between $V_{out}$ and conductor 14 and by providing P-channel transistor M10, current mirror M3,M13 and constant current source 26, which is coupled as shown to the gate of recovery transistor M4 and the output 25 of current mirror M3,M13. Recovery transistor M4 is kept off, and conductor 14 responds normally to differential input stage 13, until the drain current of current mirror output transistor M13 exceeds the constant current $I_0$. When $V_{out}$ is pulled to within 4–5 millivolts off $+V_{DD}$, then transistor M10 is turned on hard enough to cause the current mirror output current and the drain off M13 to exceed $I_0$.

This turn recovery transistor M4 on enough that conductor 15 cannot be pulled ally lower (toward $V_{SS}$) by differential input stage 13. Thus, recovery transistor M4 is not turned on and does not reduce the open-loop gain of operational amplifier 1C of FIGS. 3 and 4 for the entire range of $V_{out}$ except when $V_{out}$ is within 4 or 5 millivolts of $+V_{DD}$. Similarly, recovery transistor M40 in FIG. 4 is not turned on and does not reduce the open-loop gain off operational amplifier 1D for the entire range off the $V_{out}$ except when $V_{out}$ is within 4 or 5 millivolts of $V_{SS}$ or ground.

Figure 5:
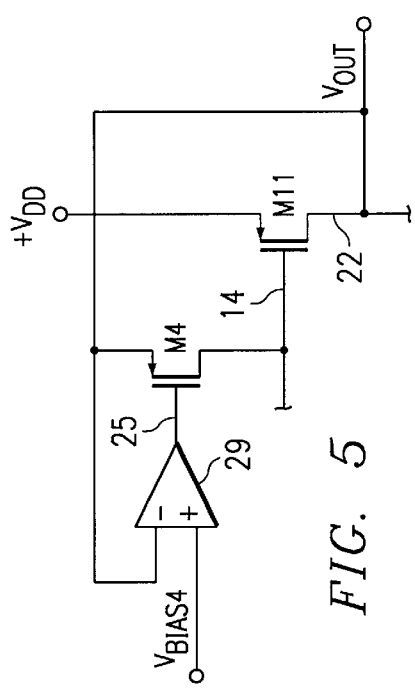
FIG. 5 is a block diagram of a generalized embodiment of the invention.

FIG. 5 illustrates a generalized embodiment of the overload recovery circuit of the present invention, wherein Vout of an amplifier or comparator circuit is applied to the source of a recovery transistor M4 and to the inverting input of a differential amplifier 29. The non-inverting input of amplifier 29 is biased at a suitable voltage VBIAS4. The output of the amplifier 29 is coupled by conductor 25 to the gate of the recovery transistor M4, the source of which is connected by conductor 14 to the gate of the output transistor M11. The output transistor M11 is coupled between a reference voltage conductor and the output conductor 22 on which the output voltage Vout is produced.

In some cases, it may be desirable to limit the amount of current supplied to another circuit, such as a slew boost circuit, during the same time that the above described embodiment of the invention limit the voltage on conductor 14 connected to the gate of the pull-up transistor M11 (or, in a bipolar implementation, during the same time that the flow of current into the base of the bipolar pull-up transistor is being limited). For example, and FIG. 1, an additional transistor similar to transistor M10 having its source connected to Vout conductor 22 and its gate connected to $V_{BIAS}$ would have its drain connected to supply current to a slew boost circuit. This would reduce power dissipation when Vout has been pulled nearly to $+V_{DD}$. In the embodiment of FIG. 2, an additional transistor can be headed with its source and gate connected to the source and gate, respectively, of transistor M10. In the embodiment of FIG. 3, such an additional transistor, which is illustrated as a P-channel transistor M 44, could be connected with its source and gate connected to the source and gate, respectively, of transistor M4. The drain of transistor M44 could be connected to an output transistor of a slew boost circuit.

Thus, the invention provides fast overload recovery for a high-speed CMOS operational amplifier by providing fast limitation of the gate voltages of the P-channel pull-up transistor M11 and the N-channel pull-down transistor M2 in response to the output voltage of the operational amplifier. The limitation of the gate voltages occurs only when $_{vout}$ is very close to either the $V_{DD}$ supply voltage or the $V_{SS}$ supply voltage.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, essentially the same circuitry can be used in a bipolar implementation to limit the amount of current flowing into the base of a bipolar output transistor, so as to prevent the output transistor from saturating in reducing the amount of "storage time" and associated circuit delay required for recombination of carriers in the base thereof.

What is claimed is:

1. A differential input circuit comprising:
   (a) an input stage receiving an input signal and having first and second output terminals;
   (b) an output stage including a pull-up transistor having a source coupled to a first supply voltage, a gate coupled to the first output terminal, and a drain coupled to an output conductor conducting an output signal, a pull-down transistor having a source coupled to a second supply voltage, a gate coupled to the second output terminal, and a drain coupled to the output conductor; and
   (c) a first overload recovery circuit coupled between the output conductor and the gate of the pull-up transistor for limiting the voltage on the gate of the pull-up transistor in response to the output voltage when the output voltage is within a first predetermined range of the first supply voltage.

2. The differential input circuit of claim 1, wherein the differential input circuit is a differential amplifier circuit.

3. The differential input circuit of claim 1 wherein the differential input circuit is a comparator circuit.

4. An operational amplifier comprising:
   (a) an input stage receiving an input signal and having first and second output terminals;
   (b) an output stage including a pull-up transistor having a source coupled to a first supply voltage, a gate coupled to the first output terminal, and a drain coupled to an output conductor conducting an output signal, a pull-down transistor having a source coupled to a second supply voltage, a gate coupled to the second output terminal, and a drain coupled to the output conductor, and an AB control circuit coupled between the gates of the pull-up transistor and a pull-down transistor; and
   (c) a first overload recovery circuit coupled between the output conductor and the gate of the pull-up transistor for limiting the voltage on the gate of the pull-up transistor in response to the output voltage when the output voltage is within a first predetermined range of the first supply voltage.

5. The operational amplifier of claim 4 including a second overload recovery circuit coupled between the output conductor and the gate of the pull-down transistor for limiting the voltage on the gate of the pull-down transistor in response to the output voltage when the output voltage is within a second predetermined range of the second supply voltage.

6. The operational amplifier of claim 4 wherein the first overload recovery circuit includes a first transistor having a source coupled to the output conductor, a gate coupled to receive a first bias voltage, and a drain coupled to the gate of the pull-up transistor.

7. The operational amplifier of claim 6 wherein the first overload recovery circuit includes a second transistor having a source coupled to the drain of the first transistor, a drain connected to the first output terminal, and a gate coupled to receive a second bias voltage, and also includes a constant current source coupled to the drain of the first transistor and the source of the second transistor to drawee constant current through the first transistor.

8. The operational amplifier of claim 4 were in the first overload recovery circuit includes a recovery transistor having a source coupled to the output conductor and a drain coupled to the gate of the pull-up transistor, a first transistor having a source coupled to the output conductor, a gate coupled to receive a bias voltage, and a drain coupled to an input of a current mirror, and a constant current source having a first terminal coupled to the first supply voltage and a second terminal coupled to the gate of the recovery transistor and an output of the current mirror.

9. The operational amplifier of claim 6 wherein the pull-up transistor and the first transistor are P-channel transistors and the pull-down transistor is an N-channel transistor.

10. The operational amplifier of claim 7 wherein the pull-up transistor, the first transistor and the second transistor are P-channel transistors, and the pull-down transistor is an N-channel transistor.

11. A method of operating differential input circuit including:
   (a) applying an input signal to an input stage;
   (b) providing an output stage including a pull-up transistor having a source coupled to a first supply voltage, a gate coupled to a first output terminal of the input stage, and a drain coupled to an output conductor conducting an output voltage, a pull-down transistor having a source coupled to a second supply voltage, a gate coupled to a second output terminal of the input stage, and a drain coupled to the output conductor, and an AB control circuit coupled between the gates of the pull-up transistor and a pull-down transistor; and
   (c) reducing the amount of time required for the differential input circuit to recover from an overload condition by limiting the voltage on the gate of the pull-up transistor in response to the output voltage when the output voltage is within a first predetermined range of the first supply voltage.

12. The method of claim 11 including reducing the amount of time required for the differential input circuit to cover from an overload condition by limiting the voltage on the gate of the second output transistor in response to the output voltage when the output voltage is within a second predetermined range of the second supply voltage.

13. A method of operating a comparator including:
   (a) applying an input signal to an input stage;
   (b) providing an output stage including a pull-up transistor having a source coupled to a first supply voltage, a gate coupled to a first output terminal of the input stage, and a drain coupled to an output conductor conducting an output voltage, a pull-down transistor having a source coupled to a second supply voltage, a gate coupled to a second output terminal of the input stage, and a drain coupled to the output conductor, and an AB control circuit coupled between the gates of the pull-up transistor and a pull-down transistor; and
   (c) reducing the amount of time required for the comparator to recover from an overload condition by limiting the voltage on the gate of the pull-up transistor in response to the output voltage when the output voltage is within a first predetermined range of the first supply voltage.

14. A method of operating an operational amplifier including:
   (a) applying an input signal to an input stage;
   (b) providing an output stage including a pull-up transistor having a source coupled to a first supply voltage, a gate coupled to a first output terminal of the input stage, and a drain coupled to an output conductor conducting an output voltage, a pull-down transistor having a source coupled to a second supply voltage, a gate coupled to a second output terminal of the input stage, and a drain coupled to the output conductor, and an AB control circuit coupled between the gates of the pull-up transistor and a pull-down transistor; and
   (c) reducing the amount of time required for the operational amplifier to recover from an overload condition by limiting the voltage on the gate of the pull-up transistor in response to the output voltage when the output voltage is within a first predetermined range of the first supply voltage.

15. The method of claim 14 wherein the limiting of the voltage on the gate of the pull-up transistor includes operating an overload recovery circuit in response to the output voltage to prevent the voltage on the gate of the pull-up transistor from being driven by the input stage to a level which turns the pull-up transistor on harder.

16. The method of claim 15 wherein the operating of the overload recovery circuit includes applying the output voltage to a source of a first recovery transistor having a drain coupled to the gate of the pull-up transistor and a gate coupled to receive a bias voltage to establish a value of the output voltage have which the first recovery transistor limits further turn-on of the pull-up transistor.

17. The method of claim 16 including coupling the drain of the first recovery transistor to the gate of the pull-up transistor.

18. The method of claim 15 wherein the operating of the overload recovery circuit includes applying the output voltage to a source of a first recovery transistor having a gate coupled to receive a first bias voltage, coupling a drain of the first recovery transistor to the gate of the pull-up transistor by means of a second recovery transistor having a source coupled to the drain of the first recovery transistor, a drain coupled to the gate of the pull-up transistor, and a gate coupled to a second bias voltage to establish a value of the output voltage at which the second recovery transistor limits further turn-on all the pull-up transistor, and coupling a constant current source to the drain of the first recovery transistor to prevent the second recovery transistor from being turned on until the drain current of the first recovery transistor exceeds the current of the constant current source.

19. The method of claim 15 wherein the operating of the overload recovery circuit includes applying the output voltage to a source of a first recovery transistor having a drain coupled to the gate of the pull-up transistor, and producing a voltage on a gate of the first recovery transistor by applying the output voltage to a source of a second recovery transistor having a gate coupled to receive a bias voltage and a drain coupled to the current mirror to mirror the drain current of the second recovery transistor into a current summing conductor coupled to the gate of the first recovery transistor and supplying a constant current into the summing conductor to turn the first recovery transistor on when the mirrored current exceeds the constant current.

* * * * *